United States Patent [19]

Morgan et al.

[11] Patent Number: 4,798,973

[45] Date of Patent: Jan. 17, 1989

[54] HIGH FREQUENCY CHARGE PUMP/INTEGRATOR CIRCUIT

[75] Inventors: John D. Morgan; William H. Giolma, both of Dallas, Tex.; Richard Boucher, Santa Clara, Calif.

[73] Assignee: Texas Instruments Incorporated, Dallas, Tex.

[21] Appl. No.: 49,632

[22] Filed: May 13, 1987

[51] Int. Cl.$^4$ .............................................. H03K 3/01
[52] U.S. Cl. ................................. 307/296 R; 307/297
[58] Field of Search ............... 307/270, 494, 498, 499, 307/296 R, 317 A, 503, 490, 228, 297; 328/127

[56] References Cited

U.S. PATENT DOCUMENTS

| | | | |
|---|---|---|---|
| 3,432,650 | 3/1969 | Thompson | 307/494 |
| 3,621,281 | 9/1969 | Hagen | 307/228 |
| 4,374,335 | 2/1983 | Fukahori et al. | 328/127 |
| 4,687,953 | 8/1987 | Varadarajan | 307/270 |

Primary Examiner—Stanley D. Miller
Assistant Examiner—Trong Quang Phan
Attorney, Agent, or Firm—Richard G. Coalter; Leo N. Heiting; Melvin Sharp

[57] ABSTRACT

A dropping resistor and a pair of differential current steering pairs coupled to the resistor with each operable to draw and cease drawing current through the resistor in response to associated corresponding input signals. An integrator is coupled through an emitter follower to one end of the resistor for integrating the current due to the difference in voltage from that voltage established when only one of the pair draws current through the resistor. Preferably the resistor is integrated on a semiconductor chip together with the remainder of the charge pump and integrator circuitry.

12 Claims, 1 Drawing Sheet

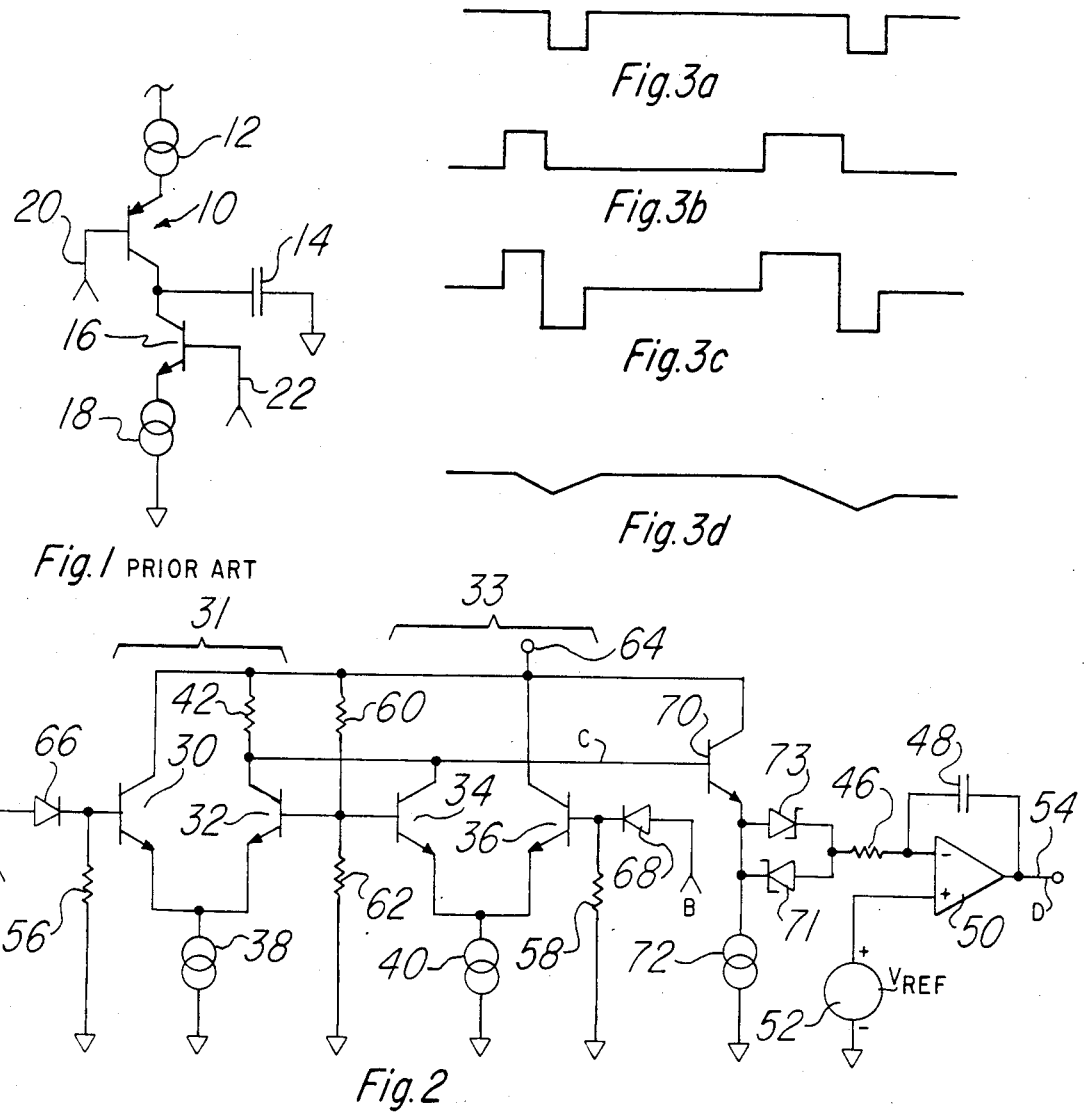
Fig.3a
Fig.3b
Fig.3c
Fig.3d
Fig.1 PRIOR ART
Fig.2
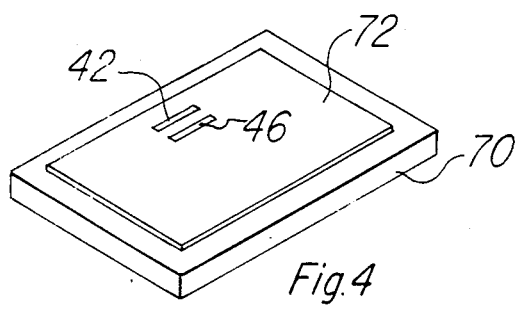
Fig.4

4,798,973

HIGH FREQUENCY CHARGE PUMP/INTEGRATOR CIRCUIT

BACKGROUND

The present invention relates to high frequency charge pump and integrator circuit capable of translating input pulses on two input lines to an output current related to the input information.

High frequency charge pumps capable of operating at frequencies of 50 megahertz or higher are difficult to design due to stray capacitance associated with the discrete components required in many applications and with the use of integrated PNP transistors in the circuit path. PNP transistors as manufactured at the present time exhibit poor high frequency characteristics.

One type of charge pump uses a tri state gate approach with an external series resistor to determine the charge and discharge currents driving into an active filter. The latter approach provides some improvement over the use of PNP transistors but also sacrifices high frequency performance due to the stray capacitance associated with discrete resistors. Thus, in order to achieve improved speed in a charge pump/integrator circuit it is necessary to develop a circuit which eliminates both PNP transistors and external resistors from the signal path.

SUMMARY OF THE INVENTION

According to one embodiment of the invention there is provided a dropping resistor and a pair of differential current steering pairs coupled to the dropping resistor and each operable to draw and cease drawing current through the dropping resistor in response to associated corresponding input signals. An integrator circuit having an input coupled to the dropping resistor integrates the current caused by the voltage change across the dropping resistor.

Preferably the dropping resistor is integrated. By using a differential pair the need to use PNP transistors in the signal path can be avoided. Through use of an integrated resistor the relatively large stray capacitance associated with external resistors is avoided.

The net output current over one cycle is related to the input information in a very precise manner, a condition maintained with temperature and semiconductor process variations, and which can, where the cycle is complete, achieve very low current leakage.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a circuit diagram showing a prior art design of a charge pump;

FIG. 2 is a circuit diagram showing a preferred embodiment of a charge pump/integrator design in accordance with the present invention;

FIG. 3 is a waveform diagram showing the waveforms at various points in the circuit; and FIG. 4 is a perspective view of the charge pump including the pump and dropping resistors integrated on a semiconductor chip.

DETAILED DESCRIPTION WITH REFERENCE TO THE DRAWINGS

Referring to FIG. 1 of the drawings there is shown a scheme according to the prior art of a charge pump. In this case a capacitor 14 is charged from a constant current source 12 through a PNP transistor 10 in response to a low level signal on base line 20 or is discharged by current drawn by a constant current generator 18 through NPN transistor 16 in response to a high level signal on line 22. The use of PNP transistor 10 limits the speed of the circuit.

A preferred embodiment of a charge pump/integrator circuit in accordance with the invention is shown in FIG. 2 in which a pair of differential switches 31 and 33 are coupled to a resistor 42. Differential pair 31 consists of NPN transistors 30 and 32 with the collector of transistor 30 connected directly to the high voltage supply terminal 64 and the collector of transistor 32 connected to one end of resistor 42. The other end of resistor 42 is connected to high voltage terminal 64. The emitters of transistors 30 and 32 are connected together and to a constant current generator 38. The base of transistor 30 is biased by resistor 56 connected to ground. Input signal A is coupled to the base of transistor 30 through diode 66. Differential pair 33 consists of transistors 34 and 36 with the collector of transistor 34 connected to one end of resistor 42 and to the base of an emitter follower transistor 70. The emitter of transistor 70 connects through parallel inverted Schottky diodes 71 and 73 to one end of resistor 46. Schottky diodes 71 and 73 create a small approximately 0.6 volt deadband about the voltage $V_{ref}$ so that small offsets at the emitter of transistor 70 do not cause leakage currents. Resistor 46 forms the input resistor of an integrator circuit consisting of operational amplifier 50 and feedback capacitor 48. the non-inverting input of operational amplifier 50 couples to a reference voltage 52. The other NPN transistor 36 has its collector coupled to high voltage terminal 64. The emitters of transistors 34 and 36 are both connected to constant current generator 40. The base of transistors 32 and 34 are both biased by resistor string 60 and 62. The base of transistor 36 is biased by resistor 58 connected to ground. Input signal B is fed through diode 68 into the base of transistor 36.

In operation with the signal B normally low transistor 36 is biased off by resistor 58 coupled to ground. Thus transistor 34 is on and supplies the current requirements of constant current source 40 coupled to its emitter by drawing that current through resistor 42. At the same time a high level A signal on the base of transistor 30 keeps the latter on and supplies the current requirements of constant current source 38. Thus, transistor 32 is kept off.

When the signal B goes high as shown in FIG. 3, it turns on transistor 36 and causes transistor 34 to turn off. Thus, the voltage C on the collectors of transistors 32 and 34 goes high and the output D from the integrator on line 54 falls as capacitor 48 charges.

When the signal B goes low again and signal A also goes low, transistor 34 turns on as does transistor 32 both drawing current through resistor 42. Thus, the voltage C at the input to the integrator falls to a minimum, discharging the feedback capacitor 48 so that the output rises back to its previous level.

If, however, signal B stays on longer than signal A as shown in the second set of pulses of FIG. 3, then the charging of capacitor 48 will occur over a longer time period than the discharging and there will be a net drop in the output voltage D on line 54. Similarly, if signal B stays on for a shorter time period than signal A there will be a rise in the output voltage D on line 54. Alternatively, it is possible to vary the duration of the pulse of signal A and cause the output D to either rise or fall.

By integrating dropping resistor 42 and pump resistor 46 on a semiconductor chip 70 as seen in FIG. 4 together with the other charge pump circuitry 72 making up the circuit of FIG. 2 the small, parallel stray capacitance associated with external resistors is avoided. Even though this capacitance may be very small, average A/C coupling in parallel with the current setting resistor 46 at high switching speeds causes a net imbalance (error) due to the non-linearity presented by the Schottky diode pair 71,73 and the finite bandwidth of the operational amplifier 50. Furthermore, since no PNP transistors are used the low frequency limitations of PNP transistors are avoided.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A charge pump circuit, comprising
   a dropping resistor;
   a current steering circuit having an output coupled to said dropping resistor and having a pair of inputs for receiving respective input signals, said current steering circuit being responsive to a first condition of said input signals for drawing no current through said dropping resistor, being responsive to a second condition of said input signals for drawing a first level of current through said dropping resistor, and being responsive to a third condition of said input signals for drawing a second level of current through said dropping resistor, wherein said second level of current is greater than said first level of current; and
   an integrator circuit having an input coupled to said dropping resistor for integrating a current caused by the voltage change across said dropping resistor, said voltage change being with respect to a voltage established by said first level of current flowing through said dropping resistor.

2. A circuit according to claim 1, wherein said current steering circuit includes two differential current steering circuits.

3. A circuit according to claim 2, wherein each of said two differential current steering circuits includes a pair of NPN transistors with the collector of one NPN transistor coupled to one end of said dropping resistor and a collector of the other NPN transistor coupled to a voltage source, and the emitters of each pair of NPN transistors coupled in common to a respective constant current generator.

4. A circuit according to claim 3, wherein said integrator includes:
   an operational amplifier having an inverting input, a non-inverting input and an output;
   an integrator pump resistor having a first end coupled via an emitter follower to a junction of said dropping resistor and the collectors of said one transistor of each said pair of NPN transistors and having a second end coupled to said inverting input of said operational amplifier;
   a capacitor coupled between said inverting input and said output of said operational amplifier;
   a reference voltage source coupled to said non-inverting input of said operational amplifier; and wherein the voltage of said reference voltage source is of a value substantially equal to the voltage produced at said junction when only said first level of current flows through said dropping resistor.

5. A charge pump circuit, comprising:
   a dropping resistor;
   a pair of differential current steering circuits, each circuit having an output coupled to a first end of said dropping resistor, each current steering circuit being responsive to a respective input signal to draw and cease drawing current through the dropping resistor; and
   a pump resistor coupled to said first end of said dropping resistor for providing an output current of a given sense when both said current steering circuits draw current through said dropping resistor, for providing an output current of an opposite sense when neither of said current steering circuits draws current through said dropping resistor and for providing substantially no output current when one of said current steering circuits draws current through said dropping resistor and the other does not.

6. A circuit according to claim 5, including an integrator coupled via said pump resistor to the first end of said dropping resistor for integrating said output current to provide an output voltage which increases when both said current steering circuits draw current through said dropping resistor, which decreases when neither of said current steering circuits draw current through said dropping resistor and which stays substantially constant when said one of said current steering circuits draws current through said dropping resistor and the other does not.

7. A circuit according to claim 5, wherein said dropping and pump resistors are integrated together with said charge pump circuit on a semiconductor chip.

8. A circuit according to claim 5, wherein each of said differential current steering circuits includes a pair of NPN transistors with the collector of one NPN transistor being coupled to said one end of said dropping resistor and with the collector of the other NPN transistor being coupled to a voltage source, and wherein the emitters of one pair of said NPN transistors being coupled to a first constant current generator and the emitters of the other pair of said NPN transistors being coupled to a second constant current generator.

9. A circuit according to claim 6, wherein said integrator includes:
   an operational amplifier;
   an emitter follower having an input connected to said first end of said dropping resistor and having an output connected via said pump resistor to an inverting input of said operational amplifier;
   a capacitor coupled between the inverting input and an output of said operational amplifier; and
   a reference voltage coupled to a non-inverting input of said operational amplifier, wherein the voltage of said reference voltage equals the voltage at said output of said emitter follower when only one of said differential current steering circuits draws current through said dropping resistor.

10. A circuit according to claim 6, further including:
an emitter follower having an input connected to said dropping resistor and having an output connected via said pump resistor to an input of said integrator; and
a pair of inverted, parallel connected Schottky diodes connected in series with said pump resistor.

11. A charge pump circuit, comprising:
a dropping resistor connected between a source of supply voltage and a circuit node;
a switched current source having a first operating mode for supplying a given current in a given sense to said node, having a second operating mode for supplying twice said given current in said given sense to said node and having a third operating mode for supplying substantially no current to said node;
an amplifier having an input coupled via a pump resistor to said node;
a reference voltage source connected to a reference input of said amplifier providing a voltage selected for causing said pump resistor to supply substantially no current to said amplifier during said first operating mode of said switched current source; and wherein
said dropping resistor, said pump resistor, said switched current source, said reference voltage source and said amplifier each being formed in an integrated circuit.

12. A charge pump circuit as recited in claim 11 further comprising:
a deadband circuit connected in series with said pump resistor and formed in said integrated circuit.

* * * * *